United States Patent
Martin et al.

(10) Patent No.: US 10,305,492 B2
(45) Date of Patent: May 28, 2019

(54) CLOCK FREQUENCY CONTROL SYSTEM

(71) Applicant: RAYTHEON COMPANY, Waltham, MA (US)

(72) Inventors: Andrew L. Martin, Waltham, MA (US); David W. Palmer, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/647,993

(22) Filed: Jul. 12, 2017

(65) Prior Publication Data

US 2019/0020347 A1   Jan. 17, 2019

(51) Int. Cl.
| | |
|---|---|
| *H03L 7/06* | (2006.01) |
| *H04J 3/07* | (2006.01) |
| *H04L 27/26* | (2006.01) |
| *G06F 1/04* | (2006.01) |

(52) U.S. Cl.
CPC .................. *H03L 7/06* (2013.01); *G06F 1/04* (2013.01); *H04J 3/07* (2013.01); *H04L 27/2657* (2013.01); *H04L 27/2675* (2013.01)

(58) Field of Classification Search
CPC .......... H03L 7/06; H04J 3/07; H04L 27/2657; H04L 27/2675
USPC ........................................................ 327/20
See application file for complete search history.

(56) References Cited

U.S. PATENT DOCUMENTS

| | | | |
|---|---|---|---|
| 6,784,716 B2 * | 8/2004 | Meguro | .................... G06F 1/08 327/298 |
| 8,446,223 B2 | 5/2013 | Gronemeyer | |
| 8,564,374 B2 * | 10/2013 | Chiu | ...................... H03L 7/097 331/1 R |
| 2008/0157884 A1 | 7/2008 | Lee | |
| 2009/0051450 A1 | 2/2009 | Shioda | |

FOREIGN PATENT DOCUMENTS

| | | |
|---|---|---|
| CN | 102195646 A | 9/2011 |
| CN | 102436174 A | 5/2012 |
| WO | 2015038478 A1 | 3/2015 |

OTHER PUBLICATIONS

"Calibrating a TCXO" https://electronics.stackexchange.com/questions/195734/calibrating-a-tcxo; Oct. 17, 2015.
(Continued)

*Primary Examiner* — Dinh T Le
(74) *Attorney, Agent, or Firm* — Burns & Levinson, LLP; Joseph M. Maraia

(57) ABSTRACT

The frequency of a clock signal is compared to a predetermined range. If the measured frequency is outside the range, a system controller determines if a current operating state of the overall system allows for the internal clock to be adjusted back into compliance. If the controller determines that the current system state allows for the change, then a control signal to the internal clock signal source is changed by the smallest increment available, either to increase or decrease the frequency. If the internal clock signal is out of the desired range, and the system controller does not decide to modify the frequency, the controller may increase the size of the range by decreasing the lower bound and/or increasing the upper bound.

21 Claims, 3 Drawing Sheets

(56) References Cited

OTHER PUBLICATIONS

"GPS PPS use as a time reference" http://mtnstormdaq.com/blog/2012/10/gps-pps-use-as-a-time-reference/; Oct. 11, 2012.
Poole, Ian; "TCXO, Temperature Compensated Crystal Oscillator" http://www.radio-electronics.com/info/data/crystals/tcxo.php; Published on or before Apr. 25, 2017.
International Search Report and Written Opinion from related PCT Application No. PCT/US2018/017054 dated Apr. 20, 2018.

* cited by examiner

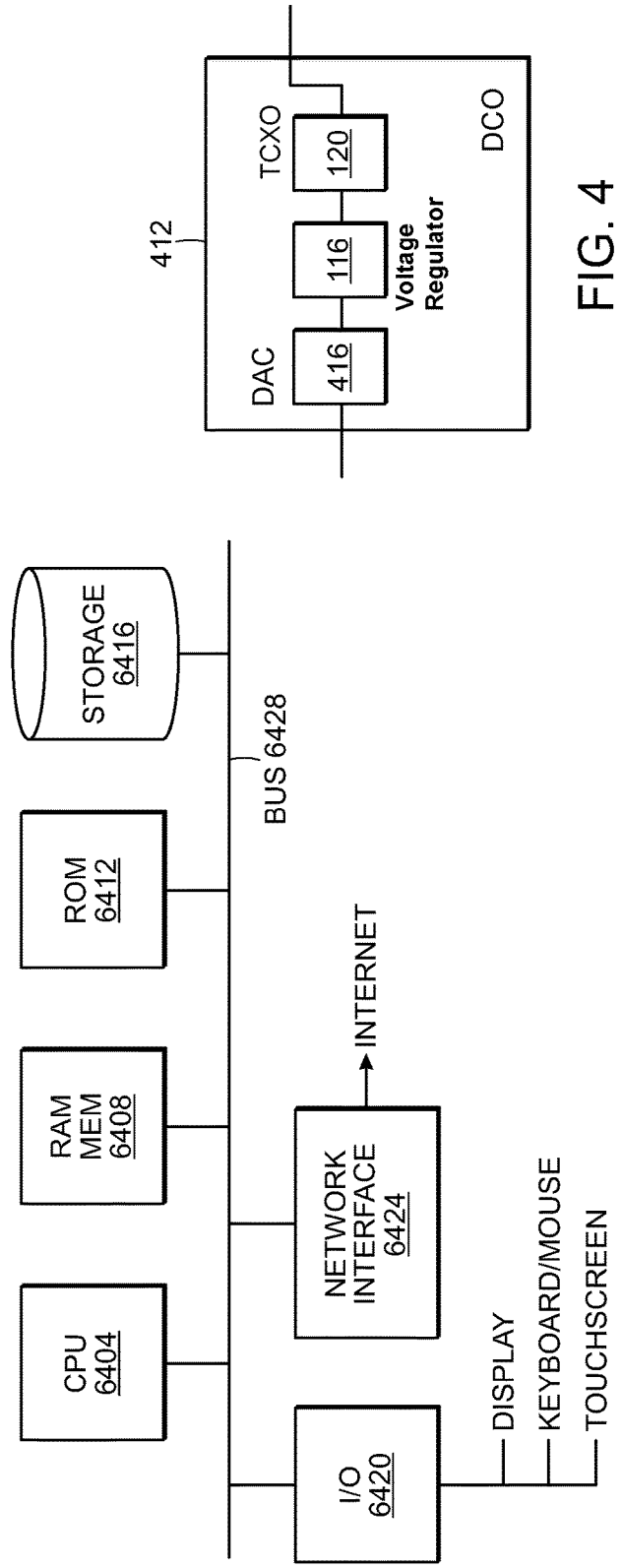

CLOCK FREQUENCY CONTROL SYSTEM

GOVERNMENT RIGHTS

This invention was made with Government support under Contract No. W15P7T-06-D-A008-0051 awarded by the U.S. Army. The Government may have certain rights in the invention.

BACKGROUND

Many systems, for example, radar and radio systems, use an internal clock signal for proper operation and synchronization. In these systems, the internal clock signal is generated by a clock signal source, for example, a temperature compensated crystal oscillator (TCXO) or a voltage controlled crystal oscillator (VCXO).

The clock signal generated by the clock signal source, however, drifts over time and the frequency changes value. If the amount of frequency drift is too much, the system may not operate properly. In many instances, the frequency of the clock signal source can only be adjusted when the whole system is taken off line for maintenance.

What is needed is an approach to controlling a clock signal source operating in a system.

SUMMARY

According to one aspect of the disclosure, a method of operating a clock signal source comprises (a) providing a control signal to the clock signal source; (b) detecting an output signal from the clock signal source; (c) measuring a value of a frequency of the output signal; and (d) comparing the measured frequency value to an operating range of frequency values initially bounded by a lower end of an initial lower value and an upper end of an initial upper value. If the measured frequency value is outside the operating range, then: (d)(1) determining if the frequency of the output signal should or should not be changed; and (d)(2) if it is determined that the frequency of the output signal should be changed, then modifying the control signal by a first predetermined value if the measured frequency is below the operating range or by a second predetermined value if the measured frequency is above the operating range. The modified control signal is then provided to the clock signal source; and repeated.

In another aspect, an apparatus comprises a clock signal source configured to provide an output signal; and a first circuit, coupled to the clock signal source, configured to: provide a control signal to the clock signal source; measure a frequency value of the output signal; compare the measured frequency value to an operating range of frequency values initially bounded by a lower end of an initial lower value and an upper end of an initial upper value, and if the measured frequency value is outside the operating range, then generate an interrupt signal indicating that the measured frequency is too slow or too fast. A processing unit is coupled to the first circuit and is configured to, upon receipt of the interrupt signal from the first circuit: determine if the frequency of the output signal should or should not be changed; and if it is determined that the frequency of the output signal should be changed, then instruct the first circuit to modify the control signal by a first predetermined value if the measured frequency is too slow or by a second predetermined value if the measured frequency is too fast.

In another aspect of the present disclosure, a method of maintaining a clock signal source at a first predetermined frequency includes: (a) providing a control signal to the clock signal source; (b) detecting an output signal from the clock signal source; (c) measuring a value of a frequency of the output signal; and (d) comparing the measured frequency value to an operating range of frequency values, the operating range initially bounded by a lower end of a first lower value and an upper end of a first upper value. If the measured frequency value is less than the first lower value or greater than the first upper value, then determining if the operation of the clock signal source should or should not be modified to change the frequency of the output signal. If it is determined that the operation of the clock signal source should be modified, then modifying the control signal by a first predetermined value if the measured frequency is less than the first lower value or by a second predetermined value if the measured frequency is greater than the first upper value; and providing the modified control signal to the clock signal source.

BRIEF DESCRIPTION OF THE DRAWINGS

Various aspects of the disclosure are discussed below with reference to the accompanying Figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, not every component may be labeled in every drawing. The Figures are provided for the purposes of illustration and explanation and are not intended as a definition of the limits of the disclosure. In the Figures:

FIG. 3 is a block diagram of a computer system; and

FIG. 4 is a block diagram of a digitally controlled oscillator (DCO).

DETAILED DESCRIPTION

Figure 1:
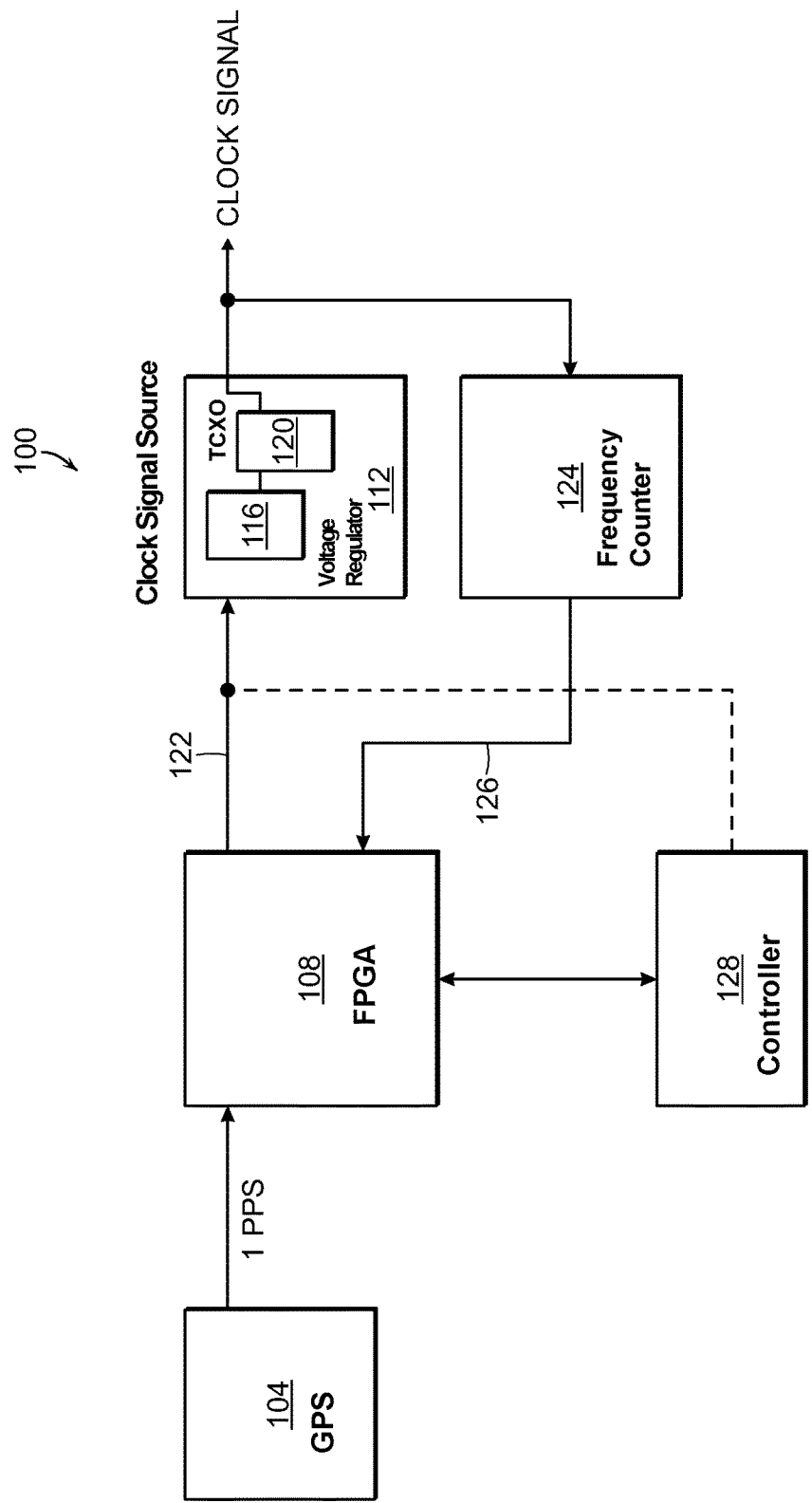
FIG. 1 is a block diagram of a system in accordance with an aspect of the present disclosure.

In the following detailed description, details are set forth in order to provide a thorough understanding of the aspects of the disclosure. It will be understood by those of ordinary skill in the art that these may be practiced without some of these specific details. In other instances, well-known methods, procedures, components and structures may not have been described in detail so as not to obscure the aspects of the disclosure.

It is to be understood that the disclosure is not limited in its application to the details of construction and the arrangement of the components set forth in the following description or illustrated in the drawings as it is capable of implementations or of being practiced or carried out in various ways. Also, it is to be understood that the phraseology and terminology employed herein are for the purpose of description only and should not be regarded as limiting.

Certain features, which are, for clarity, described in the context of separate implementations, may also be provided in combination in a single implementation. Conversely, various features, which are, for brevity, described in the context of a single implementation, may also be provided separately or in any suitable sub-combination.

Generally, and as will be described in more detail below, an internal clock signal from an internal clock signal source, is compared to an available reference signal to measure the frequency of the internal clock signal. The measured frequency is compared to a predetermined range. If the measured frequency is outside the range, an interrupt is generated to a controller of the system including an indication of whether the frequency is fast or slow. In response to the interrupt, the system controller determines if a current operating state of the overall system allows for the internal clock to be adjusted back into compliance, i.e., to within the predetermined range. The predetermined range need not result in the nominal, or desired frequency, being at the center.

If the controller determines that the current system state allows for the change, then a control signal to the internal clock signal source is changed by the smallest increment available, either to increase or decrease the frequency. The monitoring of the frequency continues and, if still out of range, another interrupt to the system controller is generated and the controller determines if the frequency can be adjusted, as determined by the current state of the system.

Assuming that the system state allows for adjustment, the foregoing measure/adjust loop will continue until the frequency is back in compliance.

It may be the situation that the system is operating in a mode where adjusting the internal clock system, however, would cause more issues than not. As the frequency drift over time may be relatively slow with respect to the real-time operation of the system, the impact may be negligible or within acceptable limits. Accordingly, the system processing unit may choose not to initiate modifying the frequency.

If, however, the internal clock signal is out of the desired range, and the system does not decide to modify the frequency for system state reasons, interrupts to the system controller may continue and be frequent. These interrupts, however, can impede operation of the controller as the interrupts have to be handled.

If the controller determines that it is receiving too many interrupts, in order to reduce the amount of resources spent attending these interrupts, the controller may change the size of the predetermined range. Accordingly, the controller may increase the size of the range by decreasing a lower bound and/or increasing an upper bound. This would reduce the number of interrupts as the measured frequency would, most likely, fall into the new range.

Once the system controller has determined that the system is now in a state of operation where it is acceptable to modify the internal clock frequency, the controller may change the range back to its initial values. Subsequent interrupts regarding an out-of-range frequency value would then be handled.

Referring now to FIG. 1, in one aspect of the present disclosure, a system 100 includes a GPS device 104 as known in the art. A Field Programmable Gate Array (FPGA) 108 is coupled to receive a 1 PPS (pulse per second) signal found on most GPS devices. Operation of the FPGA 108 will be described below. A clock signal source 112 provides a clock signal as an output and, in one non-limiting example, may include a voltage regulator 116 that controls a Temperature Compensated Crystal Oscillator (TCXO) 120. The clock signal source 112 receives a control signal 122 from the FPGA 108. As is known, the control signal 122 sets an output voltage value of the voltage regulator 116 and a frequency of the output signal from the TCXO 120 is a function of that value. The clock signal from the clock signal source 112 is coupled to an input of a frequency counter 124 configured to count cycles in the clock signal and provide a count signal 126 to the FPGA 108. A controller 128, for example, a general purpose computer, processor or processing unit, running a program in accordance with the teachings of the present disclosure, is in communication with the FPGA 108.

Figure 2:
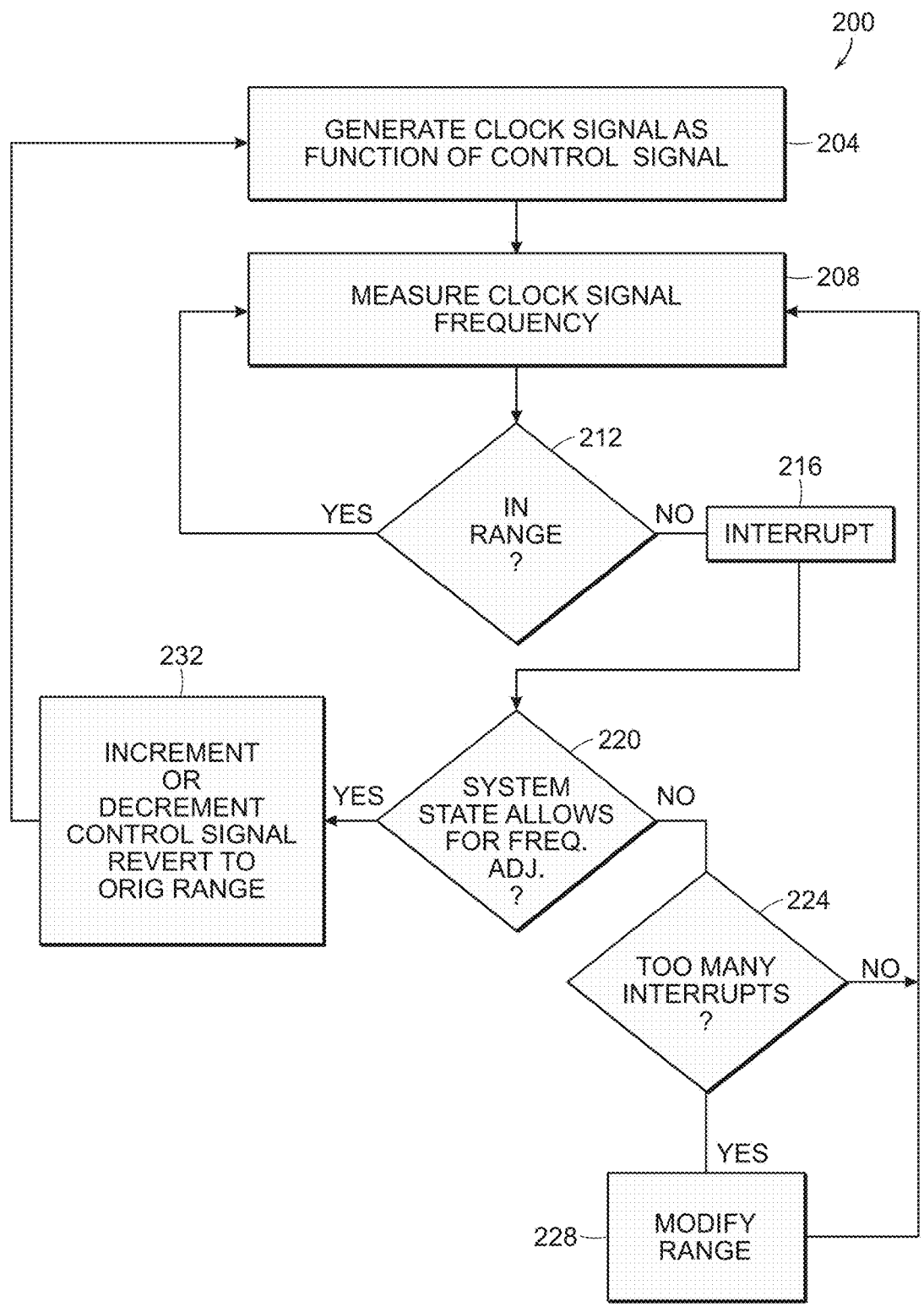
FIG. 2 is a flowchart of a method in accordance with an aspect of the present disclosure.

A method 200 in accordance with an aspect of the present disclosure begins, as shown in FIG. 2, step 204, by the clock signal source 112 generating the clock signal as a function of the control signal 122 received from the FPGA 108. The clock frequency is measured, step 208, by the FPGA 108 comparing the number of cycles counted by the frequency counter 124 between pulses received on the 1 PPS signal. If, for example, the clock is nominally running at 10 MHz, the FPGA 108 would expect that 10 million cycles were counted between successive pulses that are space one second apart. The count is compared to a predetermined range, e.g., an accuracy ranging from 1-10 ppm (parts per million), step 212. If the count is within the range, control passes back to step 208 and the clock signal frequency is checked again. The FPGA 108 may be configured to check the clock signal frequency on a schedule or to make a specific number of measurements per unit time. One of ordinary skill in the art will understand that the range is chosen depending upon the desired accuracy for the system.

If the count is not in the range, control passes from step 212 to step 216 where an interrupt is sent from the FPGA 108 to the controller 128. The controller 128 determines, step 220, whether a current operating state of the system allows for the clock signal source 112 to be adjusted back into compliance, i.e., within the predetermined range.

The controller 128 may determine that the system 100 cannot tolerate a change to the frequency of the clock signal for a number of reasons. It may be, for example, that the environmental conditions are not stable, e.g., temperature extremes of hot or cold, and changing the control signal would be impractical. Alternatively, it may be that the pending operations are dependent on the clock signal being consistent, even if out of specification, and that the pending operations need to be run to their completion with the clock signal as is.

When it is determined at step 220 that the system state is such that the clock signal should not be adjusted, control passes to step 224 to determine if too many interrupts are now being received. As the internal clock signal is out of the desired range, and the system controller 128 is not modifying the frequency for system state reasons, the FPGA 108 may continue to generate interrupts to the system controller 128. These interrupts, however, can impede operation of the controller 128 as the interrupts have to be handled.

At step 224, if the controller 128 determines that it is receiving too many interrupts, in order to reduce the amount of resources spent attending these interrupts, the controller 128 may change the size of the predetermined range used by the FPGA 108. Accordingly, step 228, the controller 128 increases the size of the range by decreasing a lower bound and/or increasing an upper bound. It should be noted that the changing of either of the upper or lower bounds need not be done by the same amount, for example, same percentage, and need not result in the nominal, or desired frequency, being at the center of the range. This would reduce the number of interrupts as the measured frequency would, most likely, fall into the new range. Control then passes to step 208.

Returning to step 220, as the controller 128 has been interrupted, when it determines that the current system state allows for the change to the clock signal source 112, then the controller 128 instructs the FPGA 108 to alter the control signal 122 to the clock signal source 112 by the smallest increment available, either to increase or decrease the frequency, step 232. The clock signal source 112 generates the control signal 122 accordingly, step 204, and the process continues.

In the case of a VCXO, the control signal 122 causes a change to an amount of voltage applied by the voltage regulator 116 to the TCXO 120. The amount of change is the smallest increment of change designed into the clock signal source 112.

The system controller 128 may keep track that the range has been modified to reduce the number of interrupts. When it has been determined that the system 100 is now in a state of operation where it is acceptable to modify the clock signal frequency, the controller 128 may change the range back to its initial values and then process any interrupts regarding an out-of-range frequency in accordance with the foregoing.

In an alternative arrangement, the controller 128 may provide the control signal 122 to the clock signal source 112 directly rather than through, or by, the FPGA 108.

Advantageously, aspects of the present disclosure provide an efficient and fast mechanism for keeping the clock signal source 112 within specification without having to take the system offline for maintenance. As the FPGA 108 operates efficiently to process the count and comparison, measurements do not take up many processing cycles. The interrupt indicates to the controller 128 that the clock is either too fast or too slow without indicating by how much.

Referring to FIG. 3, the controller 128 may be implemented on a system that may comprise a CPU 6404, RAM 6408, ROM 6412, a mass storage device 6416, for example, a disk drive, an I/O interface 6420 to couple to, for example, display, keyboard/mouse or touchscreen, or the like and a network interface module 6424 to connect to, either wirelessly or via a wired connection, to the Internet. All of these modules are in communication with each other through a bus 6428. The CPU 6404 executes an operating system to operate and communicate with these various components.

Referring now to FIG. 4, in another aspect of the present disclosure, the clock signal source 112 of FIG. 1 may be replaced with a Digitally Controlled Oscillator (DCO) 412 which is a variation of a VCXO. The DCO 412 includes a voltage regulator 116 that controls a TCXO 120. In addition, a DAC 416 receives a digital control signal and provides an analog output to the voltage regulator 116 to control the TCXO 120. Thus, the incremental increasing or decreasing of the frequency of the clock signal output from the signal source 112 may be controlled by the setting of the digital signal submitted to the DAC 416.

It should be noted that the function of the DAC 416 may be implemented in either of the FPGA 108 or the controller 128 and used in conjunction with the signal source 112 as described herein.

Various implementations of the above-described systems and methods described may be provided in digital electronic circuitry, in computer hardware, firmware, and/or software. An implementation can be as a computer program product, e.g., a computer program tangibly embodied in an information carrier. The implementation can, for example, be in a machine-readable storage device, for execution by, or to control the operation of, data processing apparatus. The implementation can, for example, be a programmable processor, a computer, and/or multiple computers.

The above-described implementations generally depict a computer implemented system employing at least one processor or processing unit executing program steps out of at least one memory to obtain the functions herein described. It should be recognized that the presently described methods may be implemented via the use of software, firmware or alternatively, implemented as a dedicated hardware solution such as an FPGA (field programmable gate array) and/or an ASIC (application specific integrated circuit). Modules, subroutines, and software agents can refer to portions of the computer program, the processor or processing unit, the special circuitry, software, and/or hardware that implements that functionality.

A computer program can be written in any form of programming language, including compiled and/or interpreted languages, and the computer program can be deployed in any form, including as a stand-alone program or as a subroutine, element, and/or other unit suitable for use in a computing environment.

As utilized, the one or more processing units may represent, for example, a CPU-type processing unit, a GPU-type processing unit, a field-programmable gate array ("FPGA"), digital signal processor(s) ("DSP"), or other hardware logic components that may, in some instances, be driven by a central processing unit ("CPU").

The computer-readable medium may store instructions executable by the one or more processing units and may include computer storage media and/or communication media. Computer storage media may include one or more of volatile memory, nonvolatile memory, and/or other persistent and/or auxiliary computer storage media.

The present disclosure is illustratively described above in reference to the disclosed implementations. Various modifications and changes may be made to the disclosed implementations by persons skilled in the art without departing from the scope of the present disclosure as defined in the appended claims.

What is claimed is:

1. A method of operating a clock signal source, the method comprising:
   (a) providing a control signal to the clock signal source;
   (b) detecting an output signal from the clock signal source;
   (c) measuring a value of a frequency of the output signal;
   (d) comparing the measured frequency value to a predetermined operating range of frequency values initially bounded by a lower end of an initial lower value and an upper end of an initial upper value and, if the measured frequency value is outside the predetermined operating range, then:
      (d)(1) determining if the frequency of the output signal should or should not be changed; and
      (d)(2) if it is determined that the frequency of the output signal should be changed, then modifying the control signal by a first predetermined value if the measured frequency is below the predetermined operating range or by a second predetermined value if the measured frequency is above the predetermined operating range;
   (e) providing the modified control signal to the clock signal source; and
   (f) repeating (b)-(e),
   wherein the clock signal source comprises a voltage regulator coupled to a voltage controlled oscillator, and wherein modifying the control signal provided to the clock signal source comprises:

changing the control signal by one of a first or second predetermined value that causes an increase in an output of the voltage regulator by a first predetermined incrementing value or causes a decrease by a first predetermined decrementing value, respectively.

2. The method of claim 1, wherein the clock signal source is a component of a system and wherein determining if the frequency of the output signal should or should not be changed is determined as a function of a current state of operation of the system.

3. The method of claim 1, wherein:
if it is determined that the frequency of the output signal should not be changed, the method further comprises:
modifying the predetermined operating range by at least one of:
setting the lower end value of the range to a value less than the initial lower value; or
setting the upper end value to a value greater than the initial upper value.

4. The method of claim 1, wherein if it least one of the operating range lower end is not currently set to the initial lower value or the operating range upper end is not currently set to the initial upper value, the method further comprising:
setting the lower end to the initial lower value; and
setting the upper end to the initial upper value.

5. The method of claim 1, wherein measuring the frequency value of the output signal comprises:
receiving a reference signal comprising a series of pulses having a predetermined time duration between sequentially adjacent pulses; and
comparing the output signal to the reference signal.

6. The method of claim 5, wherein measuring the frequency value of the output signal further comprises:
counting a number of cycles that occur in the output signal between two sequential pulses of the reference signal.

7. The method of claim 5, wherein the pulses of the reference signal occur at a rate of one pulse per second.

8. The method of claim 1, wherein the clock signal source further comprises a digital-to-analog converter having an output coupled to the voltage regulator and an input configured to receive the control signal and wherein the control signal is a digital signal.

9. An apparatus, comprising:
a clock signal source configured to provide an output signal;
a first circuit, coupled to the clock signal source, configured to:
provide a control signal to the clock signal source;
measure a frequency value of the output signal;
compare the measured frequency value to a predetermined operating range of frequency values initially bounded by a lower end of an initial lower value and an upper end of an initial upper value, and
if the measured frequency value is outside the predetermined operating range, then generate an interrupt signal indicating that the measured frequency is too slow or too fast; and
a processing unit, coupled to the first circuit, configured to, upon receipt of the interrupt signal from the first circuit:
determine if the frequency of the output signal should or should not be changed; and
if it is determined that the frequency of the output signal should be changed, then instruct the first circuit to modify the control signal by a first predetermined value if the measured frequency is too slow or by a second predetermined value if the measured frequency is too fast.

10. The apparatus of claim 9, wherein the clock signal source is a component of a system and wherein the processing unit is further configured to:
determine if the frequency of the output signal should or should not be changed as a function of a current state of operation of the system.

11. The apparatus of claim 9, wherein the processing unit is further configured to:
modify the predetermined operating range by at least one of:
resetting a lower end value of the range to a value less than the initial lower value; or
resetting an upper end value to a value greater than the initial upper value; and
sending at least one of the reset lower end value and the reset upper end value to the first circuit.

12. The apparatus of claim 9, wherein the clock signal source comprises a voltage regulator coupled to a voltage controlled oscillator and wherein:
the first circuit is further configured to:
modify the control signal by changing the control signal by one of a first or second predetermined value that causes an increase in an output of the voltage regulator by a first predetermined incrementing value or a decrease by a first predetermined decrementing value, respectively.

13. The apparatus of claim 9, wherein the processing unit is further configured to:
if it least one of the predetermined operating range lower end is not currently set to the initial lower value or the predetermined operating range upper end is not currently set to the initial upper value, then:
set the lower end to the initial lower value;
set the upper end to the initial upper value; and
send the reset upper and lower ends to the first circuit.

14. The apparatus of claim 9 wherein in the first circuit is implemented as an FPGA device.

15. The apparatus of claim 9, further comprising:
a GPS device, coupled to the first circuit, configured to output a reference signal comprising a series of pulses having a predetermined time duration between sequentially adjacent pulses; and
wherein the first circuit is further configured to measure the frequency value of the output signal by counting a number of cycles that occur in the output signal between two sequential pulses of the reference signal.

16. The apparatus of claim 15, further comprising:
a frequency counter, coupled to the first circuit and the clock signal source, configured to count the cycles of the output signal and provide the count to the first circuit.

17. A method of maintaining a clock signal source at a first predetermined frequency, the method comprising:
(a) providing a control signal to the clock signal source;
(b) detecting an output signal from the clock signal source;
(c) measuring a value of a frequency of the clock signal source output signal;
(d) comparing the measured frequency value to a predetermined operating range of frequency values, the predetermined operating range initially bounded by a lower end of a first lower value and an upper end of a first upper value;

(e) if the measured frequency value is less than the first lower value or greater than the first upper value, then determining if the operation of the clock signal source should or should not be modified to change the frequency of the output signal;

(f) if it is determined that the operation of the clock signal source should be modified, then modifying the control signal by a first predetermined value if the measured frequency is less than the first lower value or by a second predetermined value if the measured frequency is greater than the first upper value;

(g) providing the modified control signal to the clock signal source; and (h) repeating (b)-(g), wherein the clock signal source comprises a voltage regulator coupled to a voltage controlled oscillator, and wherein modifying the control signal provided to the clock signal source comprises:

changing the control signal by one of a first or second predetermined value that causes an increase in an output of the voltage regulator by a first predetermined incrementing value or causes a decrease by a first predetermined decrementing value, respectively.

18. The method of claim 17, wherein:

if it is determined that the operation of the clock signal source should not be modified, the method further comprising:

modifying the operating range of frequency values by at least one of:

setting the lower end to a second lower value less than the first lower value; or setting the upper end to a second upper value greater than the first upper value.

19. The method of claim 17, wherein modifying the control signal provided to the clock signal source comprises:

changing the control signal by one of the first or second predetermined values which causes the frequency of the clock signal source output signal to increase by a first predetermined incrementing value or decrease by a first predetermined decrementing value, respectively.

20. The method of claim 17, wherein if it least one of the predetermined operating range lower end is not set to the first lower value or the predetermined operating range upper end is not set to the first upper value, the method further comprising:

setting the lower end to the first lower value; and setting the upper end to the first upper value.

21. The apparatus of claim 12, wherein the clock signal source further comprises a digital-to-analog converter having an output coupled to the voltage regulator and an input configured to receive the control signal and wherein the control signal is a digital signal.

* * * * *